(12) United States Patent
Nakabayashi

(10) Patent No.: US 6,784,471 B2
(45) Date of Patent: Aug. 31, 2004

(54) SEMICONDUCTOR DEVICE AND MANUFACTURING METHOD THEREOF

(75) Inventor: Masakazu Nakabayashi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/151,854

(22) Filed: May 22, 2002

(65) Prior Publication Data

US 2003/0032249 A1 Feb. 13, 2003

(30) Foreign Application Priority Data

Aug. 9, 2001 (JP) ........................................ 2001-242359

(51) Int. Cl.[7] .............................................. H01L 29/76
(52) U.S. Cl. ..................... 257/288; 257/235; 257/245; 257/249; 257/382; 257/412
(58) Field of Search ................. 257/215, 235, 257/249, 262, 288, 310, 336, 374, 382, 408, 412, 245

(56) References Cited

U.S. PATENT DOCUMENTS

| | | | | |
|---|---|---|---|---|
| 4,412,900 A | * | 11/1983 | Tanaka et al. | 204/192 |
| 5,473,176 A | * | 12/1995 | Kakumoto | 257/192 |
| 6,107,660 A | * | 8/2000 | Yang et al. | 257/329 |
| 6,337,235 B1 | * | 1/2002 | Miyanaga et al. | 438/166 |
| 6,404,007 B1 | * | 6/2002 | Mo et al. | 257/324 |

FOREIGN PATENT DOCUMENTS

JP         7-297406         11/1995

OTHER PUBLICATIONS

M. Wu, et al., Mat. Res. Soc. Symp. Proc., vol. 609, pp. A28.5.1 to A28.5.6, "Thin Film Transistor Made of Polysilicon Crystallized at 950°C on Steel Substrate", 2000.

* cited by examiner

Primary Examiner—Long Pham
Assistant Examiner—Wai-Sing Louie
(74) Attorney, Agent, or Firm—Oblon, Spivak, McClelland, Maier & Neustadt, P.C.

(57) ABSTRACT

A semiconductor device capable of reducing manufacturing cost and on-state resistance is provided by selectively disposing a plurality of active regions (AR) on a main surface of a stainless steel substrate (1) and disposing a trench gate (7) so as to bury the area between the active regions (AR). The active regions (AR) have a multilayer structure that is made up of a drain layer (2) containing antimony (Sb) as an n-type impurity in a relatively high concentration ($n^+$), a polysilicon layer (3) overlying the drain layer (2) and containing a p-type impurity, and a source layer (4) overlying the polysilicon layer (3) and containing an n-type impurity in a relatively high concentration ($n^+$).

8 Claims, 10 Drawing Sheets

F I G . 1
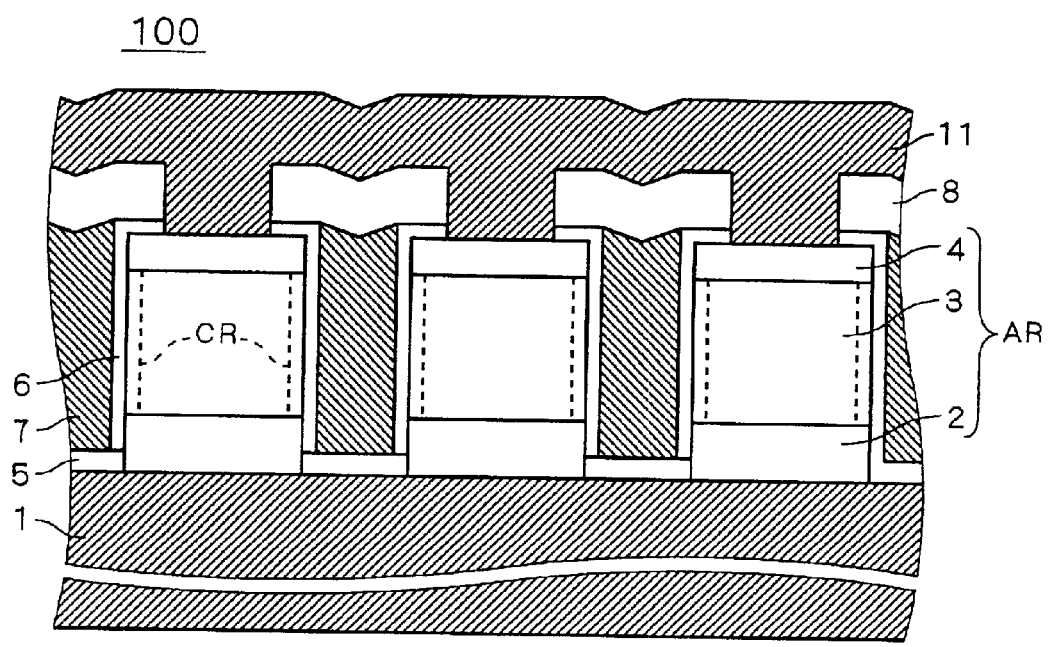
F I G . 2
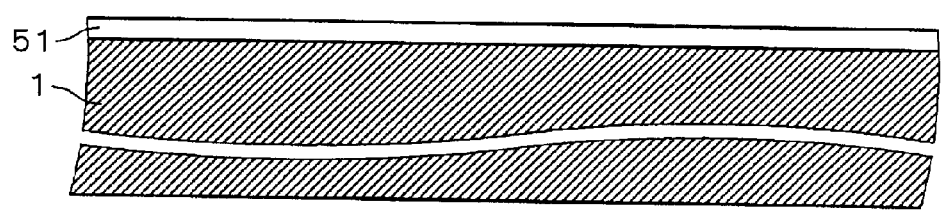

F I G . 15
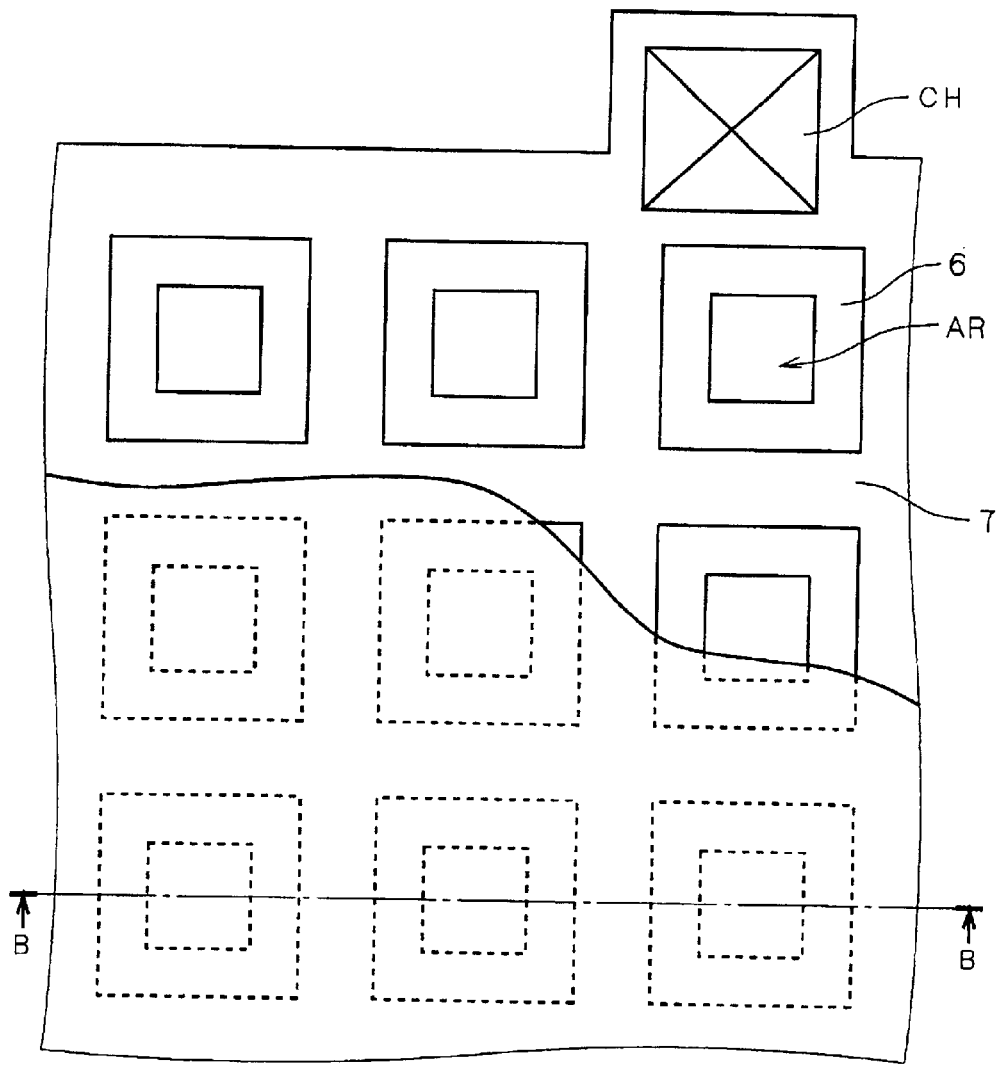
F I G . 16
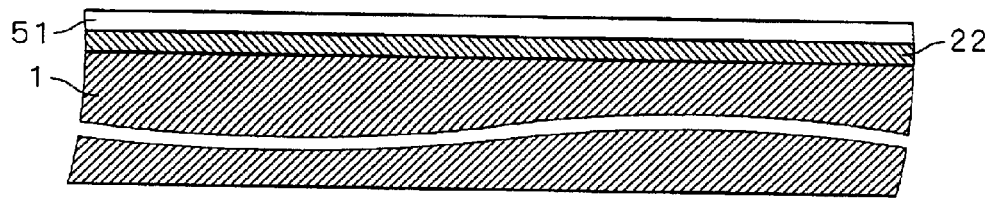

< BACKGROUND ART >

SEMICONDUCTOR DEVICE AND MANUFACTURING METHOD THEREOF

BACKGROUND OF THE INVENTION

1. Field of the Invention

The present invention relates to a semiconductor device and its manufacturing method.

2. Description of the Background Art

Conventional semiconductor devices, instead of being restricted to MOS field effect transistors (MOSFETs), are generally formed on a silicon substrate. Particularly, power semiconductor devices usually have such a structure that an epitaxial layer is disposed on a single crystal silicon substrate and a semiconductor layer is disposed in the surface of the epitaxial layer. This is because the use of the epitaxial layer facilitates controls of specific resistance value and crystal defect.

As example of conventional MOSFETs, the configuration of a trench gate type MOSFET 90 is shown in FIG. 20.

Referring to FIG. 20, the MOSFET 90 has an epitaxial layer 102 formed by epitaxial growth on a main surface of a silicon substrate 101 containing an n-type impurity at a relatively high concentration ($n^+$). The epitaxial layer 102 contains an n-type impurity at a relatively low concentration ($n^+$). A channel dope layer 103 containing a p-type impurity is disposed in the entire surface of the epitaxial layer 102.

A plurality of trenches 104 are disposed which extend from the main surface of the channel dope layer 103 and pass through the layer 103 to the inner part of the epitaxial layer 102. A gate oxide film 105 is disposed so as to cover the inner walls of the trenches 104 and the main surface of the channel dope layer 103 surrounding the trenches 104. Regions of the trenches 104 that are surrounded by the gate oxide film 105 are filled with a doped polysilicon containing a semiconductor impurity, thereby forming a gate electrode 106.

The peripheral portions of the upper surface of the gate 106 is covered with an insulating film 107. The upper part of the insulating film 107 and the upper part of the gate oxide film 105 surrounding the trenches 104 are covered with a conductor layer 108 such as of titanium. A titanium nitride (TiN) film 109 is disposed so as to cover the surface of the conductor layer 108.

In the surface of the channel dope layer 103, a source region 110 containing an n-type impurity in a relatively high concentration (n+) is selectively disposed so as to make contact with the both side surfaces of the trenches 104. A contact layer 111 containing a p-type inpurity in a relatively high concentration ($p^+$) provides a connection between the source regions 110 of the adjacent trenches 104.

The surface of the contact layer 111 is covered with a titanium silicide (TiSi) film 112, to which a source electrode 113 is connected. The source electrode 113 extends over the entire surface including the surface of the titanium nitride film 109. In a portion not shown, the titanium nitride film 109 is exposed from the source electrode 113 and it passes through the titanium nitride film 109, conductor layer 108 and insulating film 107, thereby making an electrical contact with the gate electrode 106.

A drain electrode 114 is disposed on the other main surface of the silicon substrate 101. Through a channel formed along the side surfaces of the trenches 104, the main current of the MOSFET 90 flows perpendicularly to a main surface of the silicon substrate 1.

As discussed above, the epitaxial layer 102 is arranged on the silicon substrate 101 in the conventional MOSFET 90. This arrangement increases material cost and fails to reduce manufacturing cost.

Further, the impurity concentration of the silicon substrate 101 should be increased to reduce the on-state resistance of the MOSFET 90, but it is difficult to increase the impurity concentration while maintaining crystalline, about $1\times10^{20}$ to $1\times10^{21}/cm^3$ would be the limit.

SUMMARY OF THE INVENTION

It is an object of the present invention to provide a semiconductor device capable of reducing manufacturing cost and on-state resistance.

A semiconductor device according to a first aspect of the invention includes a metal substrate, plural active regions selectively disposed on a main surface of the metal substrate, and a conductor layer being disposed above the main surface of the metal substrate and making electrical connection with the plural active regions, the plural active regions being electrically independent from one another in a direction horizontal to the main surface of the metal substrate and using the conductor layer and the metal substrate as a main electrode, so that a main current flows in a direction perpendicular to the main surface of the metal substrate in each of the plural active regions.

The plural active regions, each of which is electrically independent in a direction horizontal to the main surface of the metal substrate, are disposed on the main surface of the metal substrate, so that the main current flows in a direction perpendicular to the main surface of the metal substrate in the active regions. Thereby, the substrate cost and manufacturing cost can be reduced than may be the case of using a silicon substrate. Further, the use of the metal substrate reduces the substrate resistance and on-state resistance.

A method of manufacturing a semiconductor device according to a second aspect of the invention includes the following steps (a) to (j). The step (a) is to prepare a metal substrate. The step (b) is to form a first insulating film having a predetermined pattern on a main surface of the metal substrate. The step (c) is to bury a region defined by the pattern of the first insulating film with an impurity layer containing impurity of a first conductivity type. The step (d) is to form a full-face polysilicon layer over the entire upper parts of the first insulating film and the impurity layer. The step (e) is to subject the full-face polysilicon layer to ion implantation of impurity of a second conductivity type, followed by heat treatment, so that the impurity of the second conductivity type is diffused into the full-face polysilicon layer and the impurity of the first conductivity type in the impurity layer is diffused into the full-face polysilicon layer, thereby forming plural first semiconductor layers in the surface of a first main surface on the side of the metal substrate in the full-face polysilicon layer. The step (f) is to remove part of the full-face polysilicon layer which corresponds to the upper part of the first insulating film, to form plural polysilicon layers, each having one of the plural first semiconductor layers. The step (g) is to form a second insulating film so as to cover each of the plural polysilicon layers. The step (h) is to bury a trench gate in a trench region surrounded and defined by the first and second insulating films. The step (i) is, in the state that the trench gate is buried, to subject the plural polysilicon layers to ion implantation of impurity of a second conductivity type, to form a second semiconductor layer in the surface of a second main surface of the opposite side of the first main surface in each of the plural polysilicon layers. And the step (j) is to form above the main surface of the metal substrate a conductor layer electrically connected to the second semiconductor layer.

It is capable of disposing on the main surface of the metal substrate the MOSFET in which the main current flows in a direction perpendicular to the main surface of the metal substrate. In addition, the first semiconductor layer can be formed in the surface of the first main surface of the full-face polysilicon layer by diffusing the impurity layer of the first conductivity type that is buried in the region defined by the pattern of the first insulating film. This makes it easy to form the first semiconductor layer to be located at the lowermost layer.

A method of manufacturing a semiconductor device according to a third aspect of the invention includes the following steps (a) to (j). The step (a) is to prepare a metal substrate having on its main surface an impurity layer containing impurity of a first conductivity type. The step (b) is to form a first insulating film having a predetermined pattern on the main surface of the metal substrate. The step (c) is to form a full-face polysilicon layer covering the first insulating film and the main surface of the metal substrate. The step (d) is to subject the full-face polysilicon layer to ion implantation of impurity of a second conductivity type, followed by heat treatment, so that the impurity of the second conductivity type is diffused into the full-face polysilicon layer and the impurity of the first conductivity type in the impurity layer is diffused into the full-face polysilicon layer, thereby forming plural first semiconductor layers in the surface of a first main surface on the side of the metal substrate in the full-face polysilicon layer. The step (e) is to remove part of the full-face polysilicon layer which corresponds to the upper part of the first insulating film, to form plural polysilicon layers, each having one of the plural first semiconductor layers. The step (f) is to form a second insulating film so as to cover each of the plural polysilicon layers. The step (g) is to bury a trench gate in a trench region surrounded and defined by the first and second insulating films. The step (h) is, in the state that the trench gate is buried, to subject the plural polysilicon layers to ion implantation of impurity of a second conductivity type, to form a second semiconductor layer in the surface of a second main surface of the opposite side of the first main surface in each of the plural polysilicon layers. And the step (i) is to form above the main surface of the metal substrate a conductor layer electrically connected to the second semiconductor layer.

It is capable of disposing on the main surface of the metal substrate the MOSFET in which the main current flows in a direction perpendicular to the main surface of the metal substrate. In addition, the first semiconductor layer can be formed in the surface of the first main surface of the full-face polysilicon layer by diffusing the impurity layer of the first conductivity type formed in the surface of the main surface of the metal substrate. It is therefore extremely easy to form the first semiconductor layer to be located at the lowermost layer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view showing the configuration of a semiconductor device according to one preferred embodiment of the invention;

FIGS. 2 to 13 are sectional views showing a sequence of manufacturing steps of a semiconductor device according to one preferred embodiment of the invention;

FIGS. 14 and 15 are diagrams showing an exemplary plan configuration of a semiconductor device according to one preferred embodiment of the invention;

FIGS. 16 to 19 are sectional views showing a modification of the manufacturing steps of a semiconductor device according to one preferred embodiment.

DESCRIPTION OF THE PREFERRED EMBODIMENTS

A. Device Configuration

Figure 3:
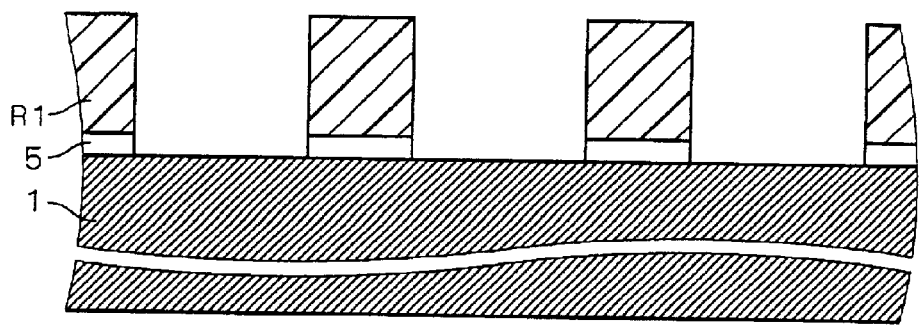

FIG. 1 shows a sectional configuration of a trench gate type MOSFET 100 that is one preferred embodiment of a semiconductor device according to the invention.

The MOSFET 100 is, as shown in FIG. 1, disposed on a main surface of a stainless steel substrate 1.

Specifically, a plurality of active regions AR are selectively disposed on the main surface of the stainless steel substrate 1, and a trench gate 7 is disposed so as to bury the area between the active regions AR.

The active regions AR overlying the main surface of the stainless steel substrate 1 have a multilayer structure made up of a drain layer 2 containing antimony (Sb) as an n-type impurity in a relatively high concentration ($n^+$), a polysilicon layer 3 overlying the drain layer 2 and containing a p-type impurity, and a source layer 4 overlying the polysilicon layer 3 and containing an n-type impurity in a relatively high concentration ($n^+$).

When the active region AR is viewed from above, it has the shape of a stripe, for example, and extends linearly in a direction of from front to rear of the configuration in FIG. 1.

A silicon oxide film 5 is disposed on the main surface of the stainless steel substrate 1 between the active regions AR, and a silicon oxide film 6 is disposed on the side surfaces of the active regions AR. In a trench defined by the silicon oxide films 5 and 6, a metal layer such as of aluminum (Al), tungsten (W), or titanium (Ti) is buried to form a trench gate 7. Hereat, the silicon oxide film 6 overlying the side surfaces of the active regions AR functions as a gate insulating film.

The electrical isolation of the trench gate 7 is held by the following arrangements that the silicon oxide film 6 is disposed so as to cover not only the side surfaces of the active regions AR but also the peripheral portions of the upper surface of the source layer 4, and that a silicon oxide film 8 is selectively disposed so as to cover the silicon oxide film 6 above the source layer 4 and the upper end surface of the trench gate 7.

A source electrode 11 is connected to the central portions of the upper surface of the source layer 4, that is, part of the source layer 4 which is not covered with the silicon oxide film 6. The source electrode 11 extends over the entire surface including the surface of the silicon oxide film 8. In a portion not shown, the silicon oxide film 8 is exposed from the source electrode 11 so as to make an electrical contact with the trench gate 7 via the silicon oxide film 8. The plan configuration of the MOSFET 100 will be described later by referring to FIGS. 14 and 15.

B. Device Operation

In the MOSFET 100 having the above configuration, the stainless steel substrate 1 becomes a drain electrode. When the device is operated, a channel CR is formed in the surface of the side surface of the polysilicon layer 3 that corresponds to the region where the silicon oxide film 6 is formed. As a result, the main current passes through the channel CR and then flows perpendicularly to the main surface of the stainless steel substrate 1.

It should be noted that the present invention is applicable to any semiconductor device in which the main current flows perpendicularly to the main surface of the stainless steel substrate. Besides the MOSFET, a power bipolar transistor or a power diode may be formed on a stainless steel substrate.

Of course, any metal other than stainless steel, which can prevent metal contamination to a semiconductor layer, is usable as a substrate. For example, refractory metal such as molybdenum (Mo) or titanium (Ti) can be used.

C. Manufacturing Method

A method of manufacturing the MOSFET 100 will be described by referring to FIGS. 2 to 13 that are sectional views illustrating a sequence of its manufacturing steps.

In the step of FIG. 2, firstly, a stainless steel substrate 1 having a thickness of 0.2 to 1 mm is prepared, and a silicon oxide film 51 having a thickness of 100 to 200 nm is formed on a main surface of the substrate 1.

As the stainless steel substrate 1, any of martensite stainless steel, ferrite stainless steel and austenite stainless steel can be used. It may have a square or rectangular plan shape, in addition to a round plan shape.

The silicon oxide film 51 is formed by high temperature oxidation (HTO). For instance, it is formed by CVD method using TEOS (tetraethyl orthosilicate) under temperature condition of about 800° C.

In the step of FIG. 3, a resist mask RI is patterned on the silicon oxide film 51. The silicon oxide film 51 not covered with the resist mask RI is removed by dry etching, so that a silicon oxide film 5 is selectively left only beneath the resist mask R1. The pattern of the resist mask R1 is set so as to correspond to the pattern of the trench gate 7 shown in FIG. 1. The width of the silicon oxide film 5 is about 0.5 µm.

Figure 4:
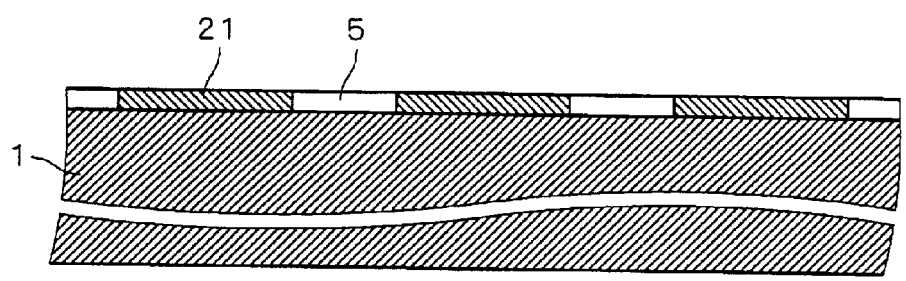

The resist mask R1 is then removed. In the step of FIG. 4, the region between the silicon oxide films 5 is buried with an antimony layer 21. The antimony layer 21 is obtained by the following manner. That is, on the stainless steel substrate 1, a mixed solution of SOG (spin on glass) solution and antimony is dropped and uniformly buried in a recess between the silicon oxide films 5 by spincoat method, and then cured by heating. Thus, since the solution containing a semiconductor impurity is used for forming the impurity layer, it is relatively easy to obtain the layer having the desired impurity type and concentration. In this instance, arsenic (As) or phosphorous (P) may be added to the SOG solution.

Figure 5:
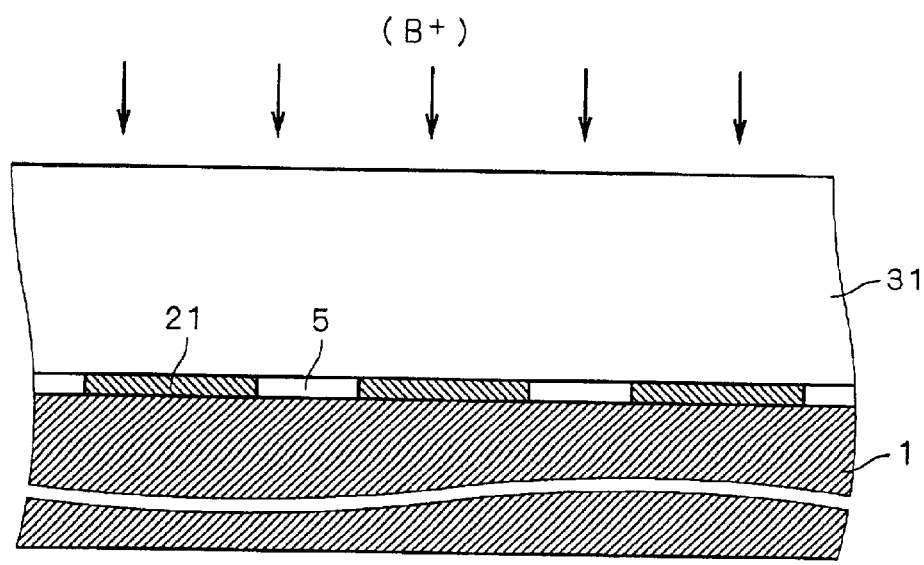

In the step of FIG. 5, a polysilicon layer 31 extending over the entire surface (i.e., a full face polysilicon layer) is formed by low pressure CVD method using monosilane gas ($SiH_4$) under temperature condition of about 620° C., for example. Thickness of the polysilicon layer 31 is about 5 µm.

Subsequently, boron (B) ion as a p-type impurity is implanted over the entire surface of the polysilicon layer 31. Its implantation conditions is, for example, at an energy of 50 keV and at a dose of $1 \times 10^{13}$ to $2 \times 10^{14}/cm^2$.

Figure 6:
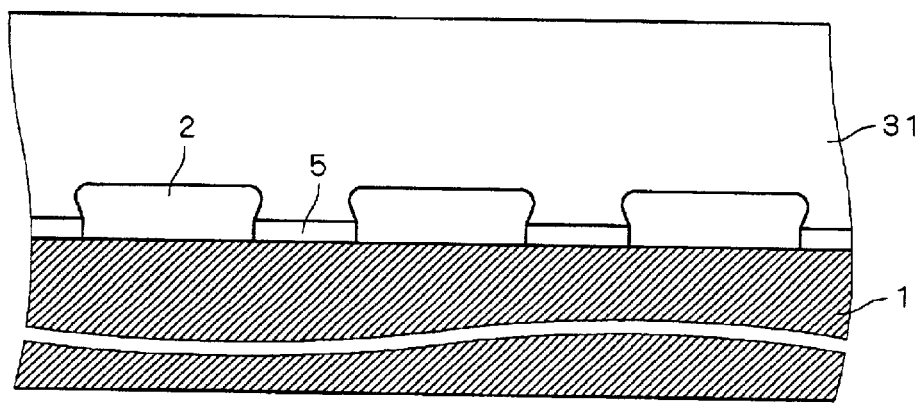

In the step of FIG. 6, in order to diffuse the boron ion thus implanted, annealing is performed under temperature condition of 1100° C. for about 40 minutes. At this time, antimony in the antimony layer 21 is also diffused into the polysilicon layer 31 to form a drain layer 2. The area where the antimony layer 21 has been present changes to the polysilicon layer 31 containing antimony as impurity, that is, the drain layer 2.

Since boron has a small mass, it diffuses perpendicularly to the entire central part of the polysilicon layer 31 during the above annealing. Since antimony has a large mass, it does not diffuse like boron. As a result, the drain layer 2 perpendicular to the polysilicon layer 31 is locally formed on the lower side of the polysilicon layer 31.

Figure 7:
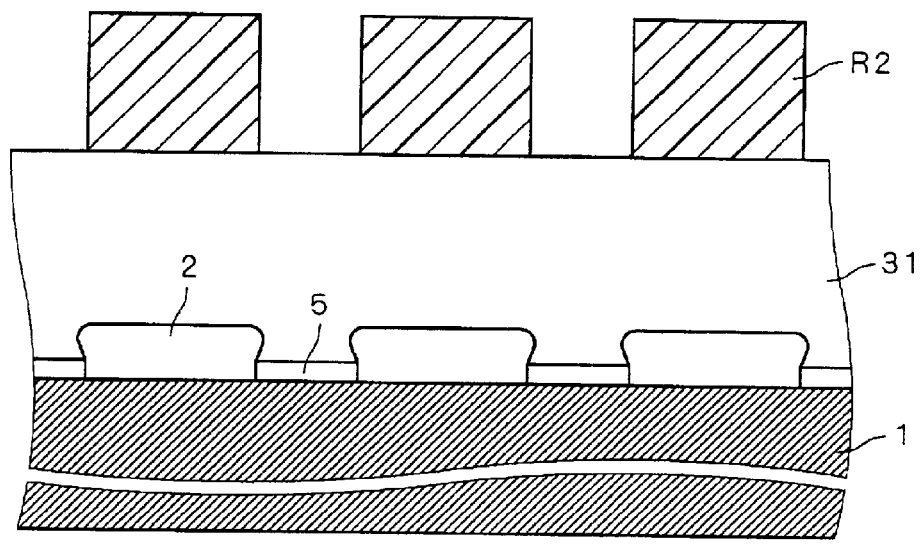

In the step of FIG. 7, a resist mask R2 is patterned on the polysilicon layer 31. The pattern of the resist mask R2 is set so as to correspond to the pattern of the active regions AR shown in FIG. 1. The width of the active region AR is about 4 µm. Although there is approximately 10 times difference in magnitude between the width of the active region AR and the spaced intervals of the active regions AR, this difference is reduced in FIG. 7, for the sake of convenience.

Figure 8:
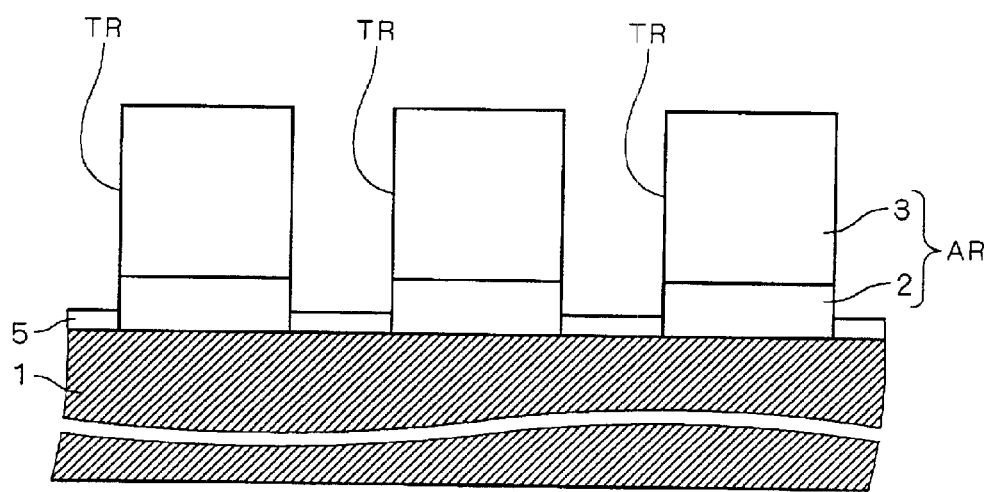

In the step of FIG. 8, the polysilicon layer 31 not covered with the resist mask R2 is removed by dry etching, so that the polysilicon layer 31 is selectively left only beneath the resist mask R2, thereby forming the active region AR. The region between the active regions AR becomes a trench TR.

Figure 9:
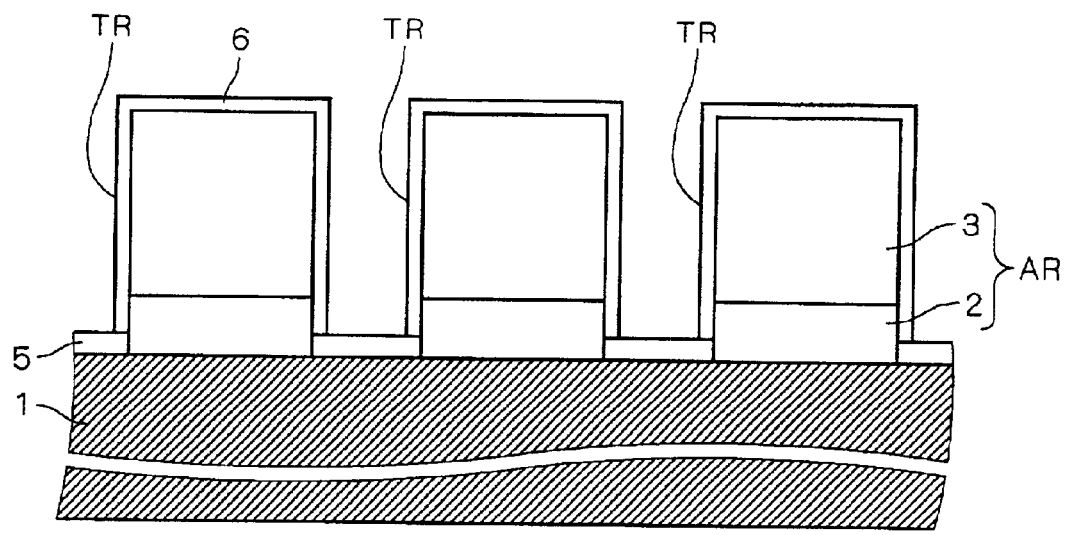

The resist mask R2 is then removed. In the step of FIG. 9, a silicon oxide film 6 is formed so as to cover the side surfaces and upper surfaces of the active regions AR. Thickness of the silicon oxide film 6 is about 25 nm, which is formed by wet oxidation with water steam, for example. Alternatively, it may be formed by dry oxidation with high temperature heating in an atmosphere of dry oxygen.

The silicon oxide film 6 may be replaced with an ON (oxide-nitride) film of stacking a silicon oxide film and a silicon nitride film one upon another, or an ONO (oxide-nitride-oxide) film of stacking a silicon oxide film, a silicon nitride film and a silicon oxide film one upon another.

To obtain the ON film, a silicon oxide film is formed by wet oxidation, and a silicon nitride film is then formed by CVD method. To obtain the ONO film, a silicon oxide film is further formed on the ON film by CVD method.

Thus, by making the gate insulating film in the form of the multilayer film having the silicon nitride film, its thickness is lessened than may be the case of making only with the silicon oxide film. Since the polysilicon layer 3 serving as an underlying layer has crystal grains, its surface is rough. Although it is necessary to increase the thickness of the silicon oxide film in order to obtain the even silicon oxide film only by oxidizing the polysilicon layer 3, the addition of the silicon nitride film permits the even silicon oxide film of less thickness, thereby increasing the reliability as a gate insulating film.

Figure 10:
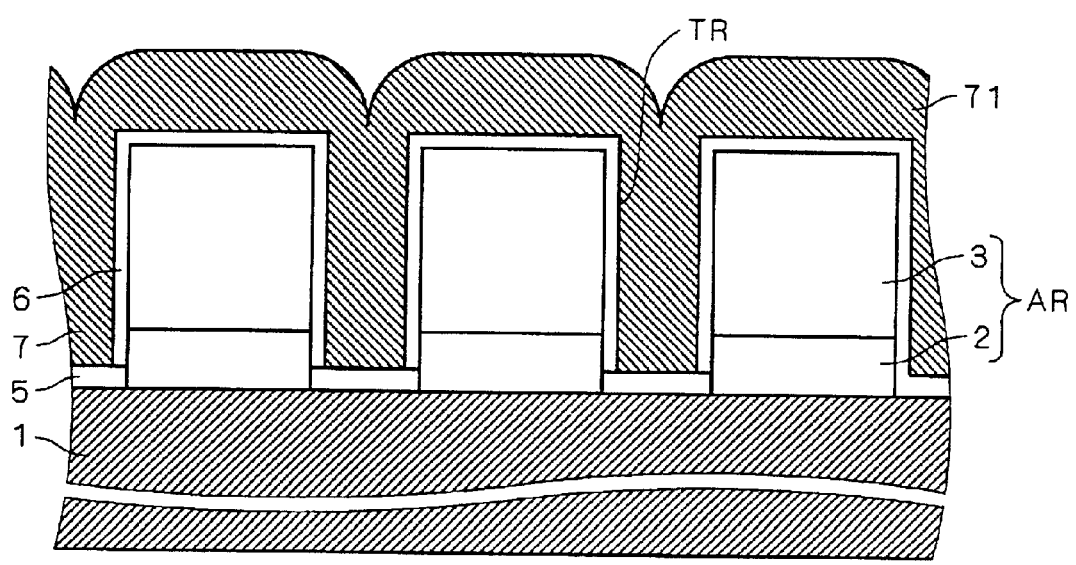

In the step of FIG. 10, a metal layer 71 is formed over the entire surface by Al, W or Ti, so that the trench TR is buried with the metal layer 71. The width of the trench is about 0.5 µm, as defined by the width of the silicon oxide film 5, and the depth of the trench TR is about 5 µm, as defined by the height of the active regions AR. The aspect ratio of the opening width to the depth is about ¹/₁₀. Accordingly, there arise no technical problems in burying the trench TR with the metal layer 71. Thickness of the metal layer 71 is preferably set to about a half of the width of the trench TR, that is, 0.2 to 0.3 µm.

The metal layer 71 thus buried in the trench TR serves as a gate electrode. Using metal as the gate electrode material lowers gate resistance. The metal layer 71 can be formed by sputtering method. This method requires temperatures of 200 to 300° C. at the most, which avoids throwing of load on the semiconductor device in process of manufacturing.

In place of metal, polysilicon that has a low resistance due to impurity can be used.

Figure 11:
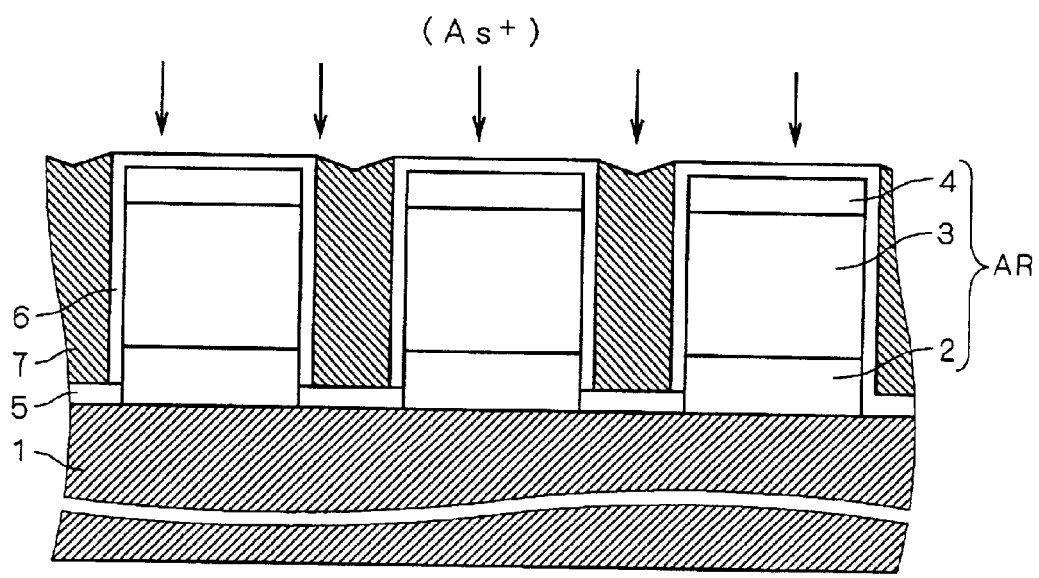

In the step of FIG. 11, by dry etching, the metal layer 71 is subjected to etch back such that the metal layer 71 is left only in the trench TR, thereby forming a trench gate 7 in the trench TR.

Subsequently, as an n-type impurity, arsenic (As) is implanted to form a source layer 4 on the upper part of the polysilicon layer 3. Its implantation conditions is, for example, at an energy of 50 keV and a dose of $1\times10^{15}$ to $1\times10^{16}$/cm².

Figure 12:
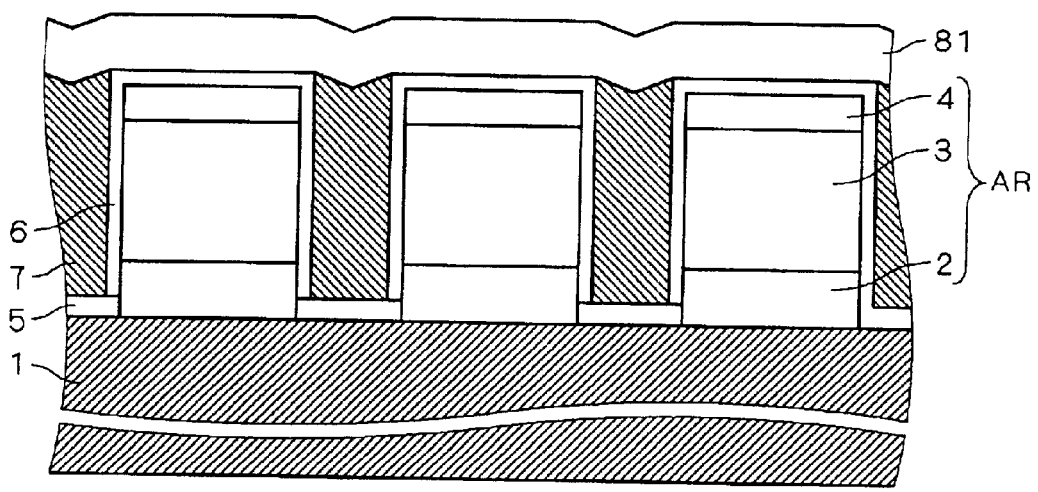

In the step of FIG. 12, a silicon oxide film 81 having a thickness of 600 to 800 nm is formed over the entire surface. The silicon oxide film 81 is a BPSG (boro-phospho silicate glass) film containing boron (B) and phosphorous (P), and it is preferably formed by atmospheric CVD method.

Figure 13:
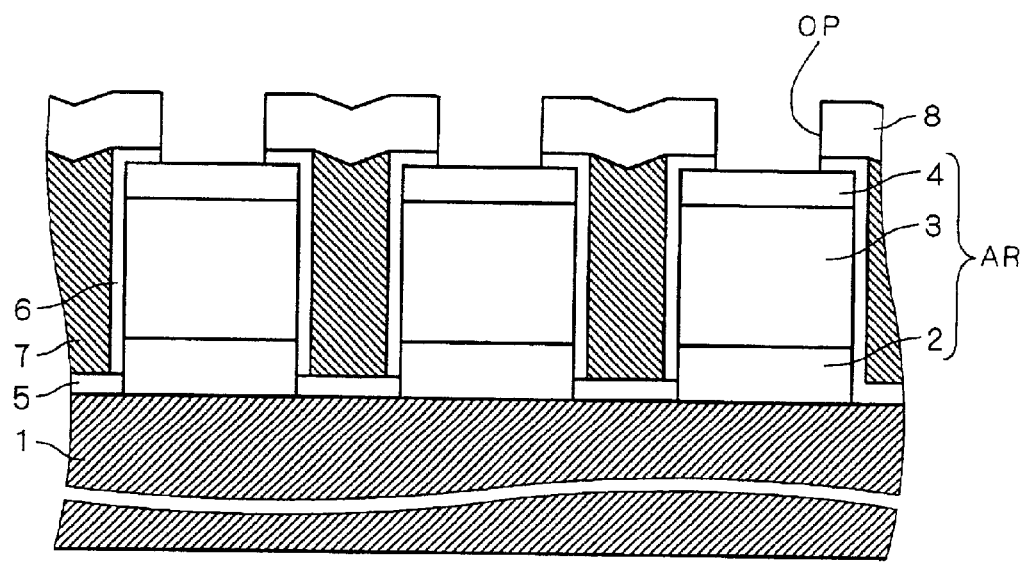

In the step of FIG. 13, part of the silicon oxide film 6 and part of the silicon oxide film 81, each corresponding to the central part of the upper surface of the source layer 4, are selectively removed by dry etching. This results in an opening OP through which the source layer 4 is exposed. Also, the silicon oxide film 81 is left so as to cover the upper end surfaces of the silicon oxide film 6 and trench gate 7 that are located above the source layer 4. This results in a silicon oxide film 8. The opening patterns of the silicon oxide film 6 and silicon oxide film 8 are set to correspond to the pattern of the active regions AR. For example, when the active regions AR have the shape of a stripe, their opening patterns have the shape of a stripe.

Finally, a metal layer such as of aluminum is formed over the entire surface so as to bury the opening OP, thereby forming a source electrode 11 shown in FIG. 1. This results in the MOSFET 100. Thickness of the source electrode 11 is about 5 μm.

An exemplary plan configuration of the MOSFET 100 will be described by referring to FIGS. 14 and 15.

Figure 14:
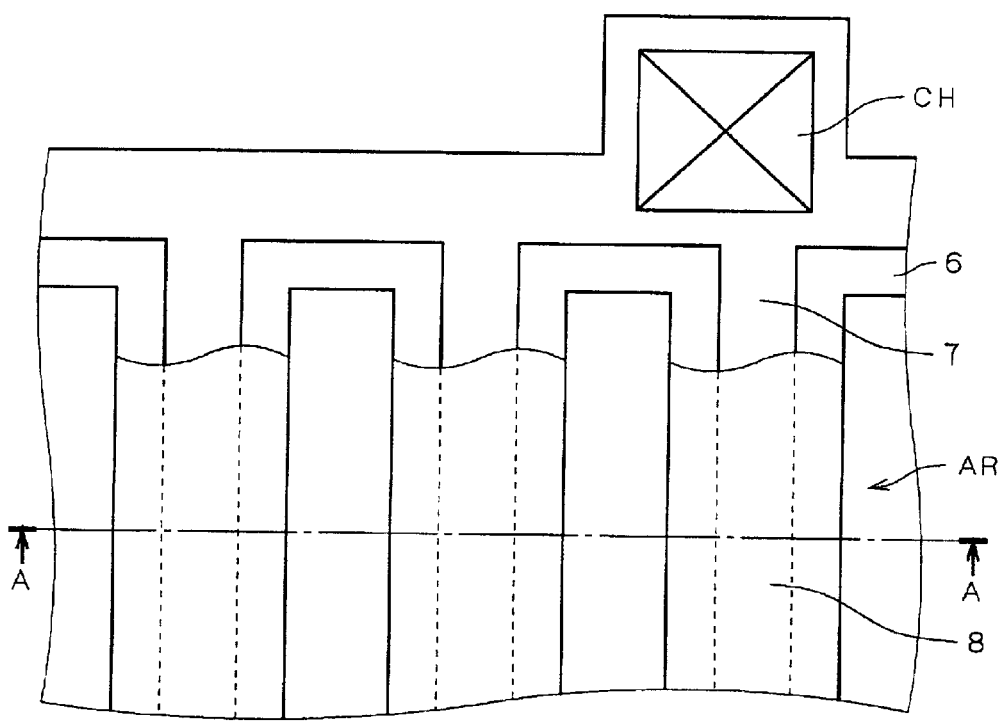

FIG. 14 shows a plan configuration of having active regions AR in the shape of a stripe when viewed from above. Plural trench gates 7 in the shape of a stripe are respectively disposed between the adjacent active regions AR in the shape of a stripe. The trench gates 7 are connected in common at peripheral portions in the direction that they extend. At the peripheral portions, the trench gates 7 are electrically connected to the exterior through a contact hole CH.

FIG. 15 shows a plan configuration of having active regions AR in the shape of a rectangle when viewed from above. A trench gate 7 is disposed such that it extends longitudinally and transversely to surround the active regions AR in the shape of a rectangle. This configuration has the shape of a lattice. At the peripheral portion of the lattice, the trench gate 7 is electrically connected to the exterior through a contact hole CH.

In FIGS. 14 and 15, there are shown the MOSFET 100 in the state of FIG. 13, and the silicon oxide film 8 overlying the trench gate 7 is partially removed for the sake of convenience. The cross section taken by the line A—A in FIG. 14 and the cross section taken by the line B—B in FIG. 15 correspond to that in FIG. 13.

D. Resulting Effects

In the foregoing MOSFET 100, on the stainless steel substrate 1, the polysilicon layer 3 is deposited to form the active regions AR, and the main current flows perpendicularly to the main surface of the stainless steel substrate 1 in the active regions AR. Therefore, the substrate cost can be lowered than may be the case of using a silicon substrate. In addition, formation time is lessened and the required manufacturing apparatus is inexpensive than may be the case of forming active regions by an epitaxial layer. There are also the following advantages.

The use of the stainless steel substrate 1 lowers substrate resistance and on-state resistance.

In manufacturing the MOSFET 100, the formation of a resist mask is performed only two times, namely when patterning the silicon oxide film 5 and when patterning the polysilicon layer 3. That is, the number of masks is small, which reduces the number of manufacturing steps and manufacturing cost.

The stainless steel substrate 1 can have a plan configuration of a square or rectangular shape, in addition to a round shape. Therefore, the semiconductor device can be formed at higher area efficiency than may be the case of a silicon substrate, the plan configuration of which is limited to a round shape.

E. Modifications of Manufacturing Method

In the manufacturing method described by referring to FIGS. 2 to 13, the drain layer 2 is formed by diffusing the antimony layer 21 filled between the silicon oxide films 5 into the polysilicon layer 31. The drain layer 2 may be formed through the steps shown in FIGS. 16 to 19. Similar reference numerals indicate the same parts as in the configuration described by referring to FIGS. 2 to 13, and the description thereof is omitted.

As shown in FIG. 16, there is prepared a stainless steel substrate 1 having in a main surface an antimony layer 22 that is formed by ion implantation. The antimony layer 22 may be formed selectively in accordance with the formation pattern of active regions AR to be formed later. Alternatively, it may be formed over the entire surface of a main surface of the stainless steel substrate 1, as shown in FIG. 16. The latter technique requires no mask for ion implantation, thereby avoiding an increase in the number of manufacturing steps and manufacturing cost.

Ion implantation conditions for forming the antimony layer 22 is, for example, at an energy of 50 keV and at a dose of $1\times10^{16}$ to $10^{17}$/cm².

Subsequently, by high temperature oxidation, a silicon oxide film having a thickness of 100 to 200 nm is formed on the upper part of the antimony layer 22.

Figure 17:
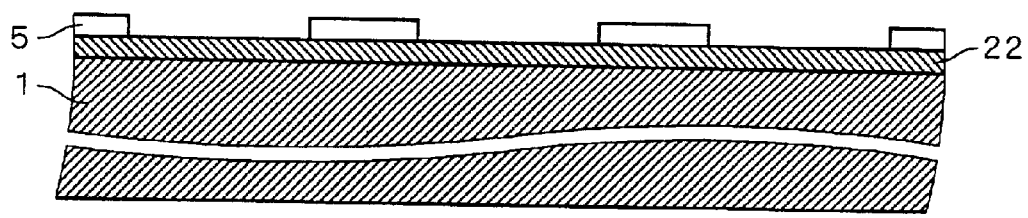

In the step of FIG. 17, a silicon oxide film 51 is patterned to selectively form a silicon oxide film 5.

Figure 18:
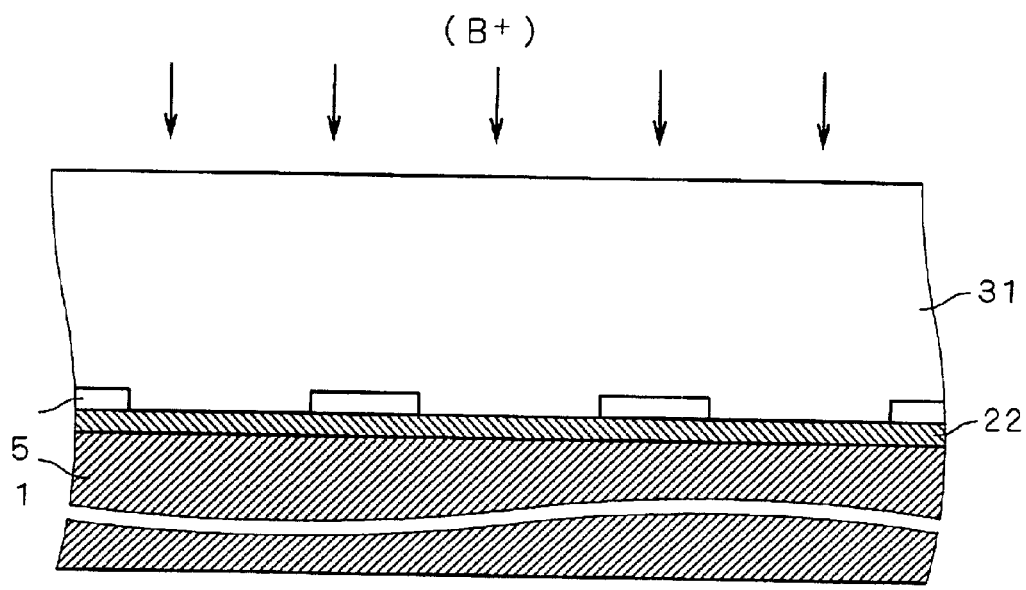

In the step of FIG. 18, a polysilicon layer 31 is formed over the entire surface by reduced pressure CVD method using monosilane gas ($SiH_4$) under temperature condition of about 620° C., for example. At this time, the region between the silicon oxide films 5 is buried with the polysilicon layer 31.

Boron (B) as a p-type impurity is then implanted over the entire surface of the polysilicon layer 31.

Figure 19:
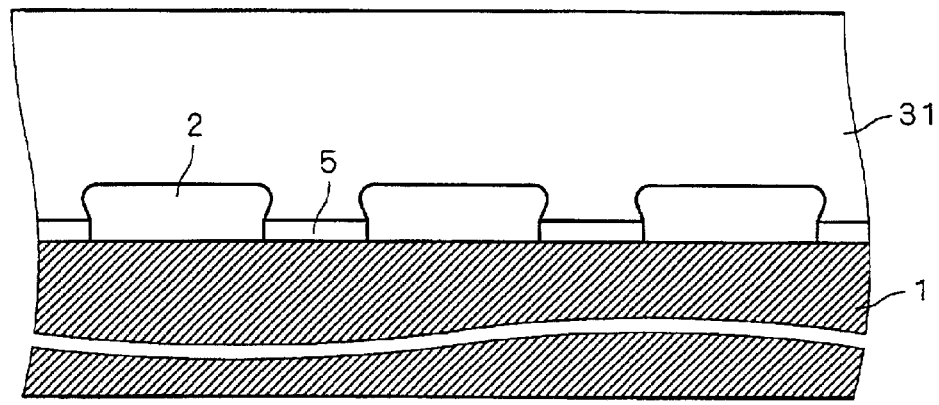
Figure 20:
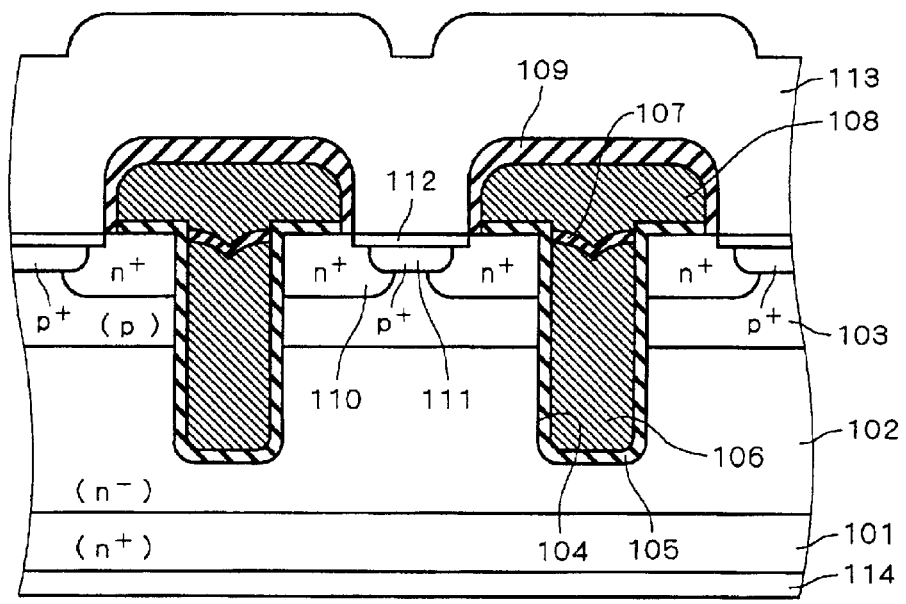
FIG. 20 is a sectional view showing the configuration of a conventional semiconductor device.

In the step of FIG. 19, in order to diffuse the boron ion thus implanted, annealing is performed under temperature condition of 1100° C. for about 40 minutes. At this time, antimony in the antimony layer 22 is also diffused into the polysilicon layer 31, resulting in a drain layer 2.

Since boron has a small mass, it diffuses perpendicularly to the entire central part of the polysilicon layer 31 during the above annealing. Since antimony has a large mass, it does not diffuse like boron. As a result, the drain layer 2 perpendicular to the polysilicon layer 31 is formed on the lower side of the polysilicon layer 31.

Then, the steps of FIGS. 7 to 13 are performed to obtain the MOSFET 100.

Thus, ion implantation is employed to form the antimony layer 22 in the main surface of the stainless steel substrate 1. This simplifies the manufacturing steps than the technique of applying the antimony solution. The use of the stainless steel substrate 1 on which the antimony layer 22 is formed beforehand further simplifies the manufacturing steps.

In place of antimony, arsenic or phosphorous ion can be implanted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a metal substrate;
    plural active regions selectively disposed on a main surface of said metal substrate; and
    a conductor layer being disposed above said main surface of said metal substrate and making electrical connection with said plural active regions,
    said plural active regions being electrically independent from one another in a direction horizontal to said main surface of said metal substrate and using said conductor layer and said metal substrate as a main electrode, so that a main current flows in a direction perpendicular to said main surface of said metal substrate in each of said plural active regions.

2. The semiconductor device according to claim 1, wherein said plural active regions are formed by plural polysilicon layers.

3. The semiconductor device according to claim 2, wherein said polysilicon layers are disposed at spaced intervals and in parallel with one another, said semiconductor device further comprising:
    a first insulating film disposed on said metal substrate between said polysilicon layers;
    a second insulating film covering at least side surfaces of said polysilicon layers; and
    a trench gate buried in a trench region surrounded and defined by said first and second insulating films,
    each of said polysilicon layers having:
        a first semiconductor layer of a first conductivity type; and
        a second semiconductor layer of the first conductivity type;
    said first semiconductor layer being disposed in the surface of each of said polysilicon layers so as to make contact with said metal substrate,
    said second semiconductor layer being disposed in the surface of each of said polysilicon layers so as to make contact with said conductor layer; and
    a region sandwiched between said first and second semiconductor layers containing impurity of a second conductivity type.

4. The semiconductor device according to claim 3, wherein said first semiconductor layer contains antimony as impurity of the first conductivity type.

5. The semiconductor device according to claim 3, wherein said second insulating film is a multilayer film made up of a silicon oxide film and a silicon nitride film.

6. The semiconductor device according to claim 3, wherein said second insulating film is a multilayer film made up of a silicon oxide film, a silicon nitride film and a silicon oxide film.

7. The semiconductor device according to claim 3, wherein said trench gate is formed by metal.

8. The semiconductor device according to claim 3, wherein said metal substrate is formed by stainless steel.

* * * * *